US011257511B1

(12) United States Patent
Peeler et al.

(10) Patent No.: US 11,257,511 B1
(45) Date of Patent: Feb. 22, 2022

(54) VOICE EQUALIZATION BASED ON FACE POSITION AND SYSTEM THEREFOR

(71) Applicant: DELL PRODUCTS, LP, Round Rock, TX (US)

(72) Inventors: Doug Jarrett Peeler, Austin, TX (US); Karun Palicherla Reddy, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/142,043

(22) Filed: Jan. 5, 2021

(51) Int. Cl.
| | |
|---|---|
| *H04N 7/15* | (2006.01) |
| *G10L 21/034* | (2013.01) |
| *G06K 9/00* | (2022.01) |
| *G06F 3/01* | (2006.01) |
| *G06F 3/16* | (2006.01) |
| *H04R 3/04* | (2006.01) |
| *G10L 25/57* | (2013.01) |
| *H04R 1/08* | (2006.01) |

(52) U.S. Cl.
CPC ............ *G10L 21/034* (2013.01); *G06F 3/012* (2013.01); *G06F 3/165* (2013.01); *G06K 9/00362* (2013.01); *G10L 25/57* (2013.01); *H04N 7/15* (2013.01); *H04R 1/08* (2013.01); *H04R 3/04* (2013.01); *H04R 2430/01* (2013.01)

(58) Field of Classification Search
CPC .... H04N 7/15; G06K 9/00; G06F 3/01; G10L 25/57; H04R 1/08; H04R 3/00; H04R 3/04; H04R 29/004; H04R 1/04

USPC ...... 348/14.01–14.16; 381/92, 107, 122, 309
See application file for complete search history.

(56) References Cited

U.S. PATENT DOCUMENTS

| | | | |
|---|---|---|---|
| 5,477,270 A | 12/1995 | Park | |
| 6,757,397 B1* | 6/2004 | Buecher | H04R 1/04 348/14.08 |
| 9,747,068 B2 | 8/2017 | Laaksonen et al. | |
| 10,834,498 B2* | 11/2020 | Kapinos | G06K 9/00221 |
| 2006/0133623 A1* | 6/2006 | Amir | H04R 3/00 381/92 |
| 2008/0246833 A1* | 10/2008 | Yasui | H04N 7/142 348/14.08 |
| 2014/0337016 A1* | 11/2014 | Herbig | H04M 3/568 704/201 |
| 2015/0365628 A1* | 12/2015 | Ben-Bassat | H04N 13/20 348/14.1 |
| 2019/0268460 A1* | 8/2019 | Agrawal | H04M 1/72454 |
| 2020/0021778 A1* | 1/2020 | Benzaia | H04L 65/1069 |

* cited by examiner

*Primary Examiner* — Melur Ramakrishnaiah
(74) *Attorney, Agent, or Firm* — Larson Newman, LLP

(57) ABSTRACT

A method may include enabling a camera to capture an image of a user operating an information handling system. An orientation of the user's head relative to a microphone may be determined based on the image. The method may further include retrieving a lookup table identifying attenuation of particular frequencies of human speech as a function of head angle. The method concludes by adjusting a gain of a signal received from the microphone to compensate for the attenuation, the adjusting based on the lookup table and based on the user's head orientation.

20 Claims, 6 Drawing Sheets

VOICE EQUALIZATION BASED ON FACE POSITION AND SYSTEM THEREFOR

FIELD OF THE DISCLOSURE

This disclosure generally relates to information handling systems, and more particularly relates to voice equalization based on face position.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A method may include enabling a camera to capture an image of a user operating an information handling system. An orientation of the user's head relative to a microphone may be determined based on the image. The method may further include retrieving a lookup table identifying attenuation of particular frequencies of human speech as a function of head angle. The method concludes by adjusting a gain of a signal received from the microphone to compensate for the attenuation, the adjusting based on the lookup table and based on the user's head orientation.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
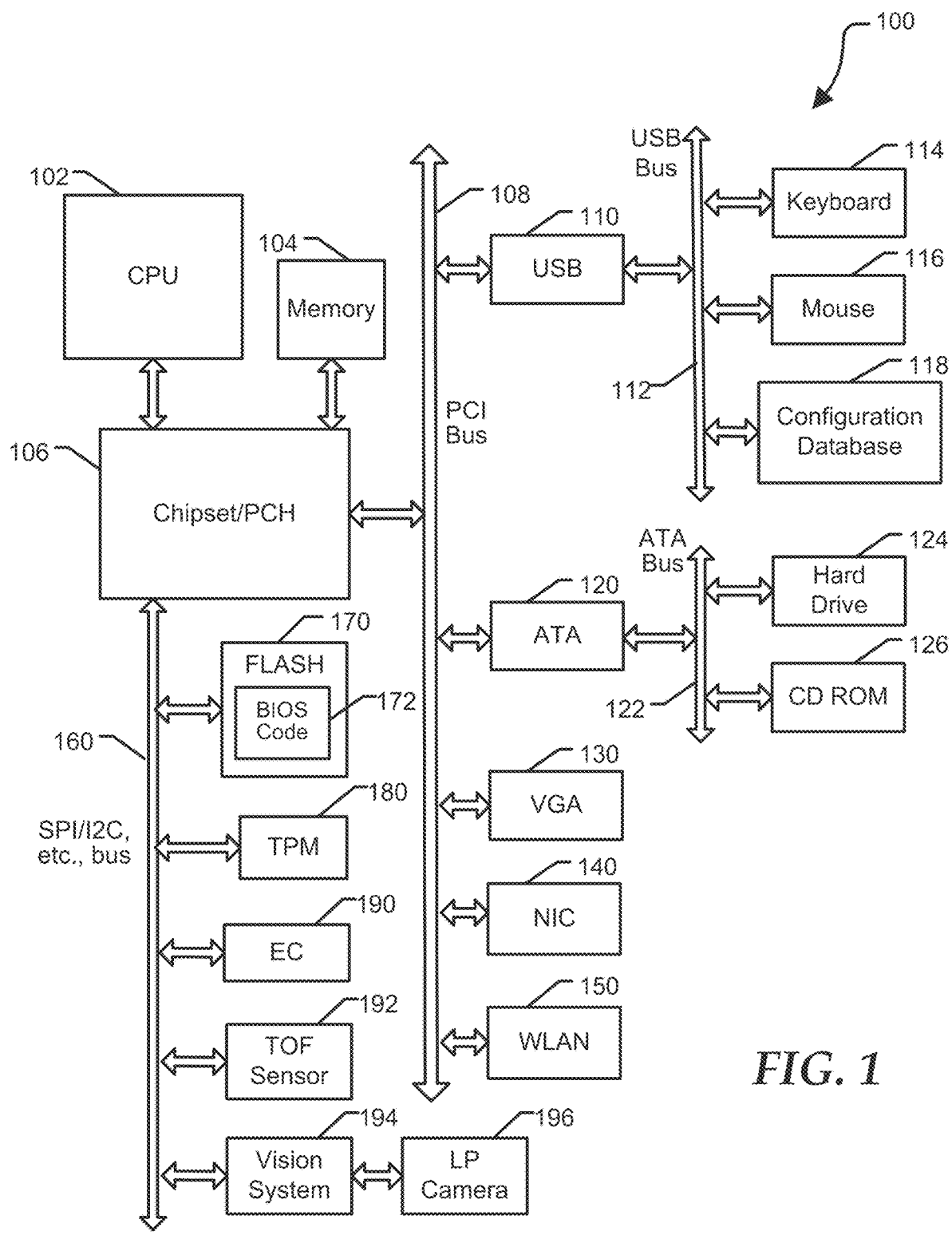
FIG. 1 is a block diagram of an information handling system according to a specific embodiment of the present disclosure.

FIG. 1 illustrates an information handling system 100 including a processor 102, a memory 104, a chipset 106, a PCI bus 108, a universal serial bus (USB) controller 110, a USB 112, a keyboard device 114, a mouse device controller 116, an ATA bus controller 120, an ATA bus 122, a data storage device 124, a compact disk read only memory (CD ROM) device 126, a video graphics array (VGA) device 130, a network interface controller (NIC) 140, a wireless local area network (WLAN) controller 150, one or more serial buses 160, a non-volatile rand access memory (NVRAM) 170 for storing a basic input/output system (BIOS) 172, a trusted platform module (TPM) 180, an embedded controller (EC) 190, a time of flight (TOF) proximity sensor 192, a vision system 194, and a low power (LP) camera 196.

TOF sensor 192 can be used to identify the presence of a user proximate to information handling system 100. A TOF sensor typically includes an infra-red light source such as a light emitting diode to provide illumination, a photoelectric detector, and a timing circuit to calculate the time it takes for light to travel from the light source to an object, and back to the detector. The photoelectric detector can include a single sensor element or an array of elements similar to sensors used in digital cameras. Alternatively, TOF sensor 192 can operate using radio waves, similar to radar systems. TOF sensor 192 can be installed at information handling system 100, for example incorporated at a display device. During operation, TOF sensor 192 can determine the distance between a user and the TOF sensor.

LP camera 196 typically captures a low resolution image relative to a high definition (HD) camera that may be included at information handling system 100 (HD camera not shown at FIG. 1). For example, LP camera 196 may provide images having 320×240 pixels (QVGA) or another resolution. LP camera 196 may be capable of detecting infrared light, and may be coupled to an infrared light source to provide illumination of objects in the vicinity of LP camera 196. LP cameral 196 typically consumes a small fraction of the power required to operate an HD camera, for example a few mW or lower. Accordingly, LP camera 196 may be referred to as an always-on camera sensor (AoS), capable of operating even when information handling system in a sleep state.

Vision system 194 is configured to analyze an image provided by LP camera 196 to identify a gaze direction of a user operating information handling system 100. Vision system 194 may utilize machine-learning, similar artificial intelligence technology algorithms, or dedicated logic to identify an orientation of a user's head relative to LP camera 196. To maintain privacy and security, images captured by LP camera 196 can be provided only to vision system 194, thereby being inaccessible to other processes executing at system 100.

NVRAM 170 can be referred to as a serial peripheral interface (SPI) flash storage device, BIOS SPI, and the like. TPM 180 is configured to ensure that the boot process starts from a trusted combination of hardware and software, and continues until the operating system has fully booted and applications are running. TPM 180 is compliant with an international standard for a secure cryptoprocessor, a dedicated microcontroller designed to secure hardware through integrated cryptographic keys. EC 190 can be referred to as a service processor, a baseboard management controller (BMC), and the like. EC 190 includes a processor that can operate out-of-band with respect to CPU 102. For example, remote management systems can utilize EC 190 to access components at information handling system independent of an operating state of CPU 102. EC 190 may be responsible for performing low level hardware tasks including thermal management and power management operations.

BIOS 172 includes instructions executable by CPU 102 to initialize and test the hardware components of system 100, and to load a boot loader or an operating system (OS) from a mass storage device. BIOS 172 additionally provides an abstraction layer for the hardware, i.e. a consistent way for application programs and OS to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device. After the initialization procedure is complete and an operating system, such as Windows, is loaded, computational operation of information handling system can begin. BIOS 172 can be substantially compliant with one or more revisions of the UEFI specification. The UEFI specification provides standard interfaces and interoperability guidelines for devices that together make up an information handling system. The UEFI specification allows for the extension of platform firmware by loading UEFI driver and UEFI application images. For example, an original equipment manufacturer can include customized or proprietary images to provide enhanced control and management of the information handling system 100.

Information handling system 100 can include additional components and additional buses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and one ore more components can be integrated together. For example, portions of chipset 106 can be integrated within CPU 102. In an embodiment, chipset 106 can include a platform controller hub (PCH). System 100 can include additional buses and bus protocols. Serial bus 160 is representative of one or more buses and/or bus protocols, such as a serial peripheral interface (SPI) bus, an inter-integrated circuit protocol (I2C) bus, a system management bus (SMB), a power management bus (PMBus), and the like. Additional components of information handling system 100 can include one or more storage devices that can store machine-executable code, one or more communications ports for communicating with external devices, and various input and output (I/O) devices, such as a keyboard, a mouse, and a video display.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as CPU 102, a programmable logic array (PLA), an embedded device such as a System-on-a-Chip (SoC), or other control logic hardware. Information handling system 100 can also include one or more computer-readable medium for storing machine-executable code, such as software or data.

A video conference system and other voice-over-Internet protocol (VOIP) systems typically include a microphone to capture a user's voice. Human speech does not radiate uniformly. The directional nature of frequencies and the types of energy associated with pronunciation of vowels and consonants affect intelligibility. Communication is most clear when the person speaking is facing the microphone. The microphone of a VOIP system is often included at a display device of an information handling system, so it remains in a fixed position. As a user adjusts their head and torso position while talking, such as looking to the side or in an upward or downward direction, particular frequencies of the user's voice may be attenuated relative to other frequencies, which may have significant impact on intelligibility. An equalization circuit can be used to process the audio signal received at the microphone to compensate for the attenuation by adjusting the amplitude of selected frequencies. For example, an equalizer may be configured to adjust the amplitude of selected frequency bands, such as individual octaves or fractions of an octave. Alternatively, a parametric equalizer can adjust the center frequency and gain of each of one or more band pass filters. As disclosed herein, an equalizer can be used to dynamically adjust the frequency content of voice signals received at a microphone based on the position of a user's head, thereby correcting for attenuation of particular frequencies that may impact intelligibility of the speaker's voice by other members of the VOIP session.

Figure 2:
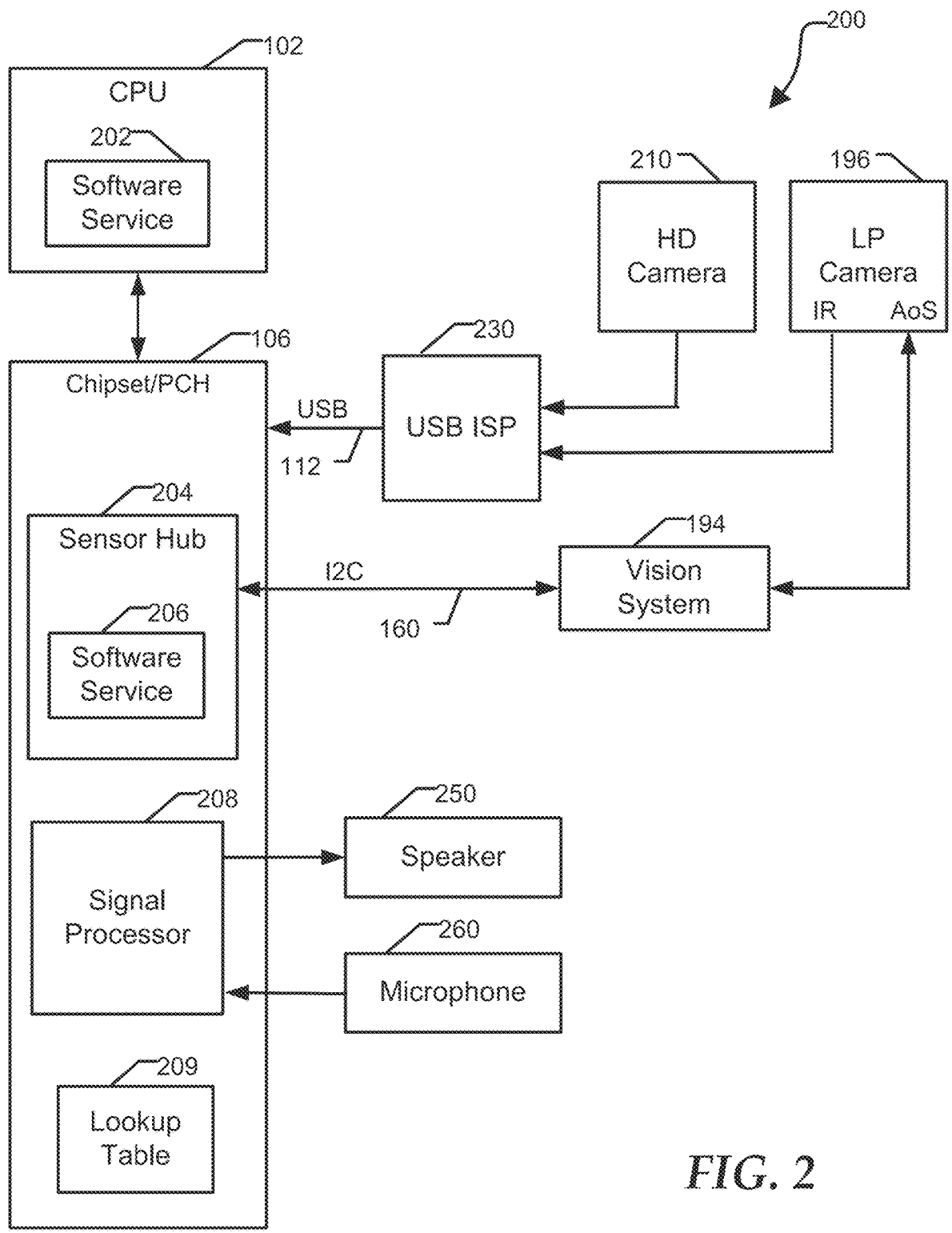
FIG. 2 is a block diagram illustrating a sensor integration system according to a specific embodiment of the present disclosure.

FIG. 2 shows a sensor integration system 200 according to a specific embodiment of the present disclosure. System 200 includes CPU 102, chipset 106, HD camera 210, LP camera 196, a USB image signal processor (ISP) 230, vision system 194, speaker 250, and microphone 260. CPU 102 is configured to execute a sensor integration software service 202. Chipset 106 includes a sensor hub 204, a signal processor 208, and a lookup table 209. Sensor hub 204 includes a microcontroller (not shown at FIG. 2) that is configured to execute a sensor integration software service 206. USB ISP 230 is configured to process images received from HD camera 210 and optionally images received from LP camera 196, and provide video to chipset 106 via a USB interface. Vision system 194 is configured to receive an image from LP camera 196, analyze the image, and provide information identifying a user's head position to sensor hub 204 via I2C bus 160. Software service 202 is configured to execute at CPU 102 during runtime while information handling system 100 is under the control of an operating system. Sensor integration software service 206 may execute at sensor hub 204 independent of the operating/sleep state of system 100.

Speaker 250 may represent any type of audio playback transducer, such as a loudspeaker, headphones, ear buds, and the like. System 200 can include a single monophonic audio output device, a pair of devices to provide a stereo image, or additional devices to provide surround-sound effects. Microphone 260 is any audio transducer capable of converting sound waves into electrical signals and may include a microelectromechanical system (MEMS) device or another type of audio capturing device. System 200 can include a single microphone, a stereo pair of microphones, or and array of microphones. Speaker 250 and microphone 260 can be incorporated at a display device associated with information handling system 100, or may include discreet devices proximate to system 100.

Signal processor 208 is configured to modify properties of audio signals provided to speaker 250 and/or received from microphone 260, as directed by software service 202 or software service 206. In particular, signal processor 208 may be configured to adjust amplitude, phase and spatial delay, frequency content (equalization), dynamic range, compression, expansion, provide noise suppression, and the like, of an audio signal. Software services 202 or 206 can configure signal processor 208 to adjust audio properties of signals received from microphone 260 and/or provided to speaker 250 based on the orientation of a user's head. The particular adjustments can be specified at lookup table 209, which stores information identifying how the frequency content of human speech received at microphone 260 may be attenuated based on the head position of the user. For example, lookup table 209 can include information predetermined in an acoustic laboratory, the information identifying a degree of attenuation of a selection of frequency bands as a function of the user's head direction.

During operation, LP camera 196 and/or HD camera 210 can be configured to capture an image of a user positioned at information handling system 100. The image can be processed to determine an orientation of the user's head relative to microphone 260. For example, vision system 194 can analyze an image captured by LP camera 196 to determine whether the user is speaking directly towards microphone 260, looking to one side or another while speaking, or looking up or down while speaking. Software service 202 or 206 can access lookup table 209 to determine which frequencies may be attenuated based on the user's head direction relative to microphone 260. The software service can configure signal processor 208 to provide gain at those frequencies in order to compensate for the attenuation, thereby returning amplitude of the attenuated frequencies to the level that they would be expected if the user had spoken directly at microphone 260. Similarly, signal processor 208 can attenuate particular frequency bands that may be boosted due on head orientation.

In an embodiment, signal processor 208 can be configured to provide microphone beamforming and speaker beam steering. Microphone beamforming is a signal processing technique where a microphone array can be designed to be more sensitive to sound coming from one or more specific directions than sound coming from other directions. Beamforming can be used to improve the fidelity of signals received from microphones based on the position or gaze direction of a user. Beam steering is a similar technology typically associated with audio playback from two or more speakers, such as a line-array of speakers, where sound pressure can be directed towards specific locations relative to the location of the speakers. Beam steering can be used to improve the fidelity of sound generated by speakers based on the position or gaze direction of a user. Beamforming, beam steering, and other signal processing techniques can be used in a VOIP scenario to improve the perceived sound quality for attendees, both listeners and speakers. Software services 202 and 206 can implement and dynamically adjust these techniques in real time as participants move or change their head position during a VOIP session.

Figure 3:
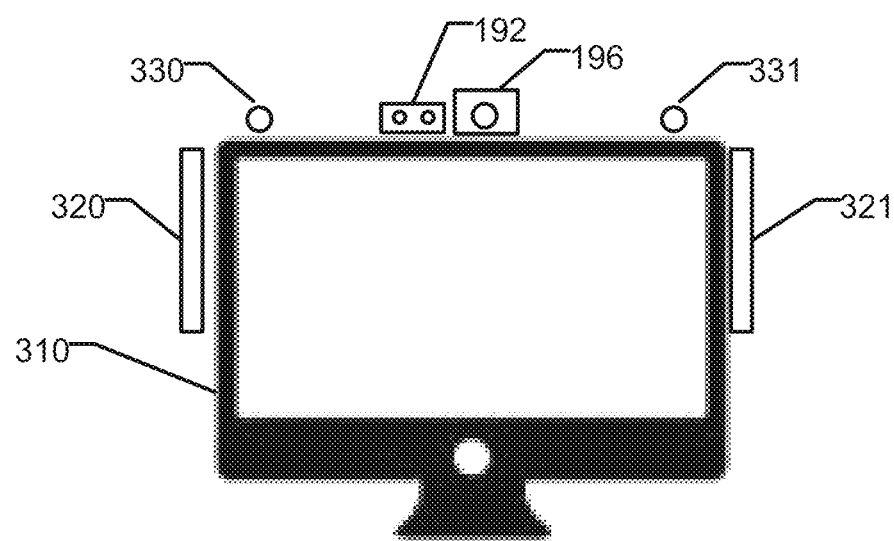
FIG. 3 is a diagram illustrating a display device according to a specific embodiment of the present disclosure.

FIG. 3 shows a display device 310 according to a specific embodiment of the present disclosure. Display device 310 can be a discreet device coupled to information handling system 100 or an integral part of system 100. Display device 310 can include TOF sensor 192, LP camera 196, speakers 320 and 321, and microphones 330 and 331. LP camera 196 is configured to capture images in the general direction of a user operating system 100. TOF sensor 192 can be used to determine whether a user is present at information handling system 100, and may further identify how far away from display 310 that the user is positioned.

Figure 4:
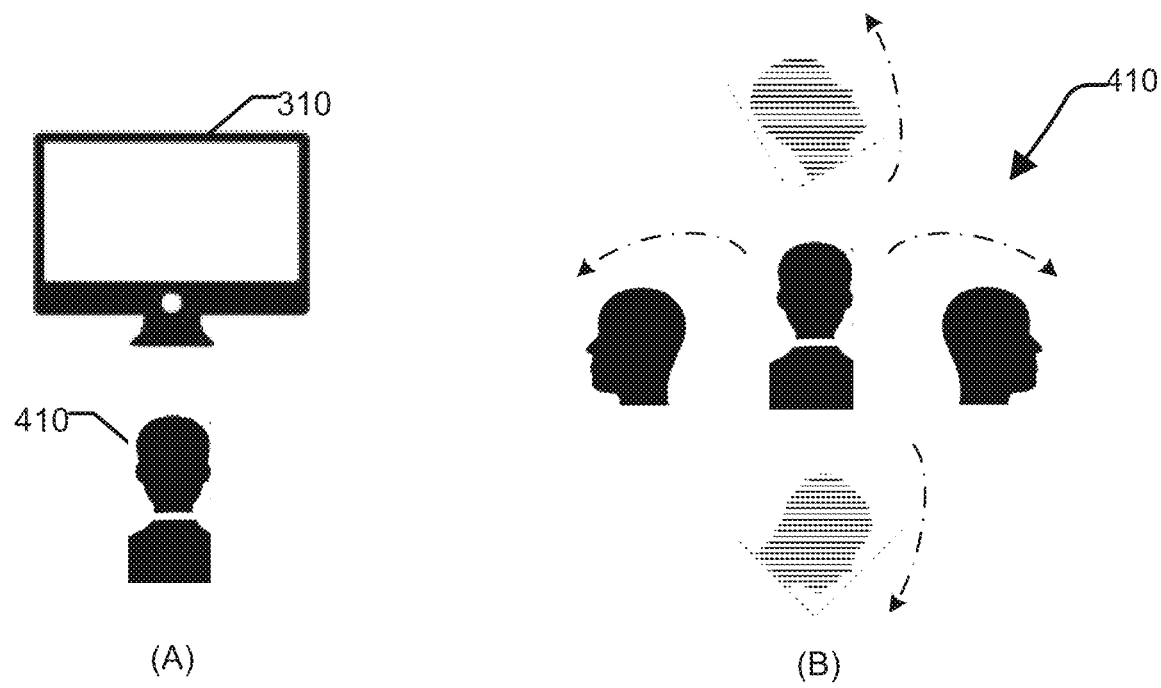
FIG. 4 is a diagram illustrating various orientations of a user's head relative to a microphone according to a specific embodiment of the present disclosure.

FIG. 4 shows a user 410 situated at display device 310. Diagram (A) shows user 410 positioned looking directly at the front of display device 310 and, accordingly, microphones 330 and 331. Diagram (B) shows user 410 looking to the left and right, and looking up and down. While a finite number of facial orientations are shown for clarity, cameras 196 and 210 and associated systems may be configured to identify the orientation of a user's head over a continuous range of horizontal and/or vertical angles. During operation, software services 202 and/or 206 can determine which direction user 410 is looking based on information provided by LP camera 196 and vision system 194, or by HD camera 210. The position of the head of user 410 relative to display 310 and microphones 330 and 331 can be used to adjust audio properties of signals received at microphones 330 and 331, and to adjust audio properties of signals provided to speakers 320 and 321.

Figure 5:
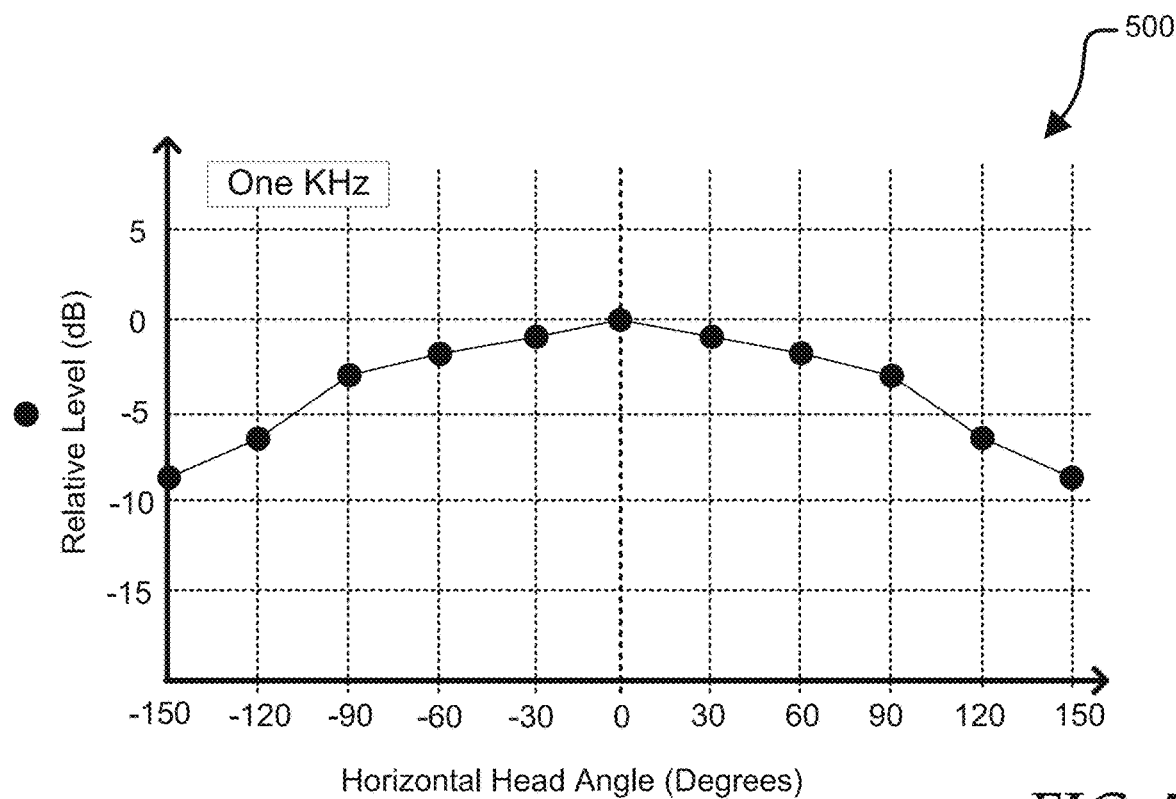
FIGS. 5 and 6 are graphs illustrating how the frequencies of human voice received at a microphone may depend on a position of a speaker's head, according to specific embodiments of the present disclosure.
Figure 6:
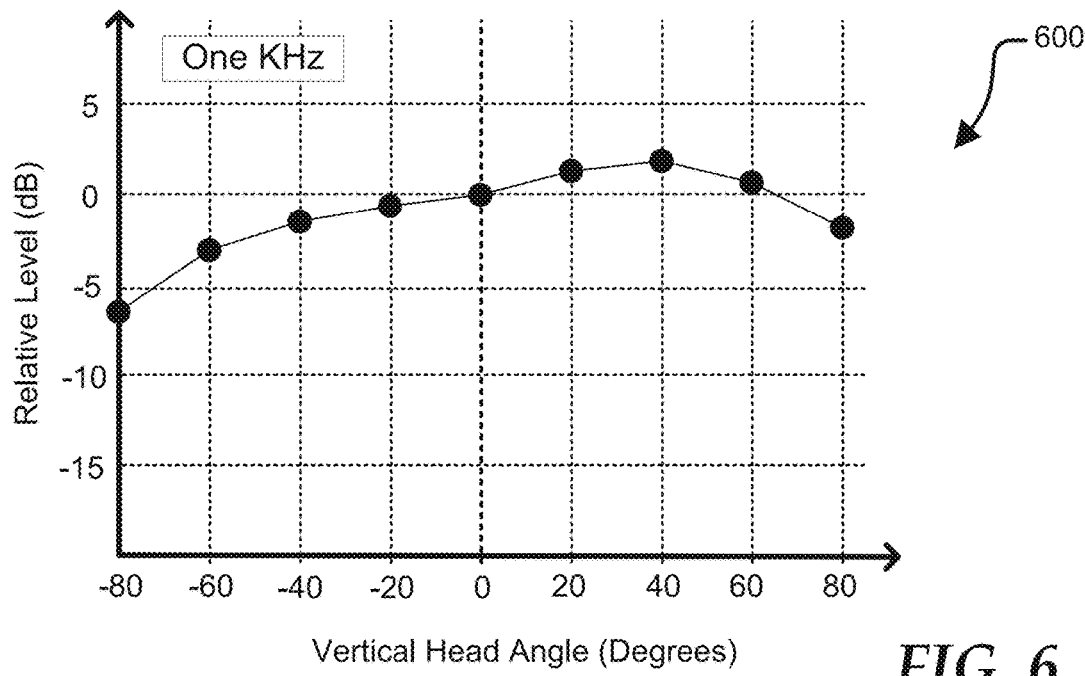

FIGS. 5 and 6 show how the frequencies of human voice received at a microphone may depend on an orientation of a speaker's head, according to specific embodiments of the present disclosure. FIG. 5 shows how a one KHz frequency present in human voice is attenuated, from the perspective of microphone 260, as a user turns their head from left to right. FIG. 5 shows a graph 500 having a horizontal and a vertical axis. The horizontal axis represents an angle in degrees, where zero degrees corresponds to the user speaking directly at a microphone, negative ninety degrees corresponding to the user speaking to the left, perpendicular to the direction of the microphone, and positive ninety degrees corresponding to the user speaking to the right, perpendicular to the direction of the microphone. The vertical axis represents amplitude, in decibels (dB). Data provided at graph 500 is normalized so that a one KHz frequency component of the user's speech corresponds to zero dB when the user is speaking directly at microphone 260. Graph 500 shows how the one KHz component of the user's speech may be progressively attenuated as the user turns their head to the left or to the right. The data points illustrated at graph 500 are merely shown for example, and actual attenuation (or relative gain) over a range of angles may depend on the acoustic properties of microphone 260, the dimensions of the room where the data is collected, the user's voice and body characteristics, and the like.

While graph 500 illustrates attenuation of a one KHz signal, additional graphs may illustrate attenuation of other frequencies. For example, attenuation based on angle information can be compiled for a number of different frequency bands that are present in human voice. The frequency bands may correspond to octaves, fractions of an octave, or the like. An example of frequency bands arranged by octave may be one hundred and twenty-five Hz, two hundred and fifty Hz, five hundred Hz, one KHz, two KHz, four KHz, and eight KHz. The frequencies bands that have the greatest impact on intelligibility, for example between one and four KHz, are also the frequency bands that may be most affected by the orientation of the user's face relative to microphone 260.

FIG. 6 shows a how a one KHz signal present in human voice is attenuated, from the perspective of microphone 260, as a user turns their head in an upward or downward direction. Graph 600 includes a horizontal axis representing an angle in degrees, where zero degrees corresponds to the user speaking directly at a microphone, negative angles correspond to the user looking downward, and positive angles correspond to the user looking upwards. As described above with reference to FIG. 5, attenuation (or relative gain) over a range of angles may be affected by numerous factors, so the data points at graph 600 are merely shown for example. The frequency content of human speech may depend in part on the acoustic properties of the user's mouth, neck and upper torso. For example, a user's voice may include more high frequency information when the user's head is looking upward, relative to looking directly ahead or downward.

The information at each graph can be incorporated into a lookup table, such as lookup table 209 that is accessible by software service 202 and/or 206. During operation, the software service can configure signal processor 208 to adjust individual frequency bands of the signal received from microphone 260 to compensate for the attenuation at those bands due to the user not speaking directly at microphone 260.

Figure 7:
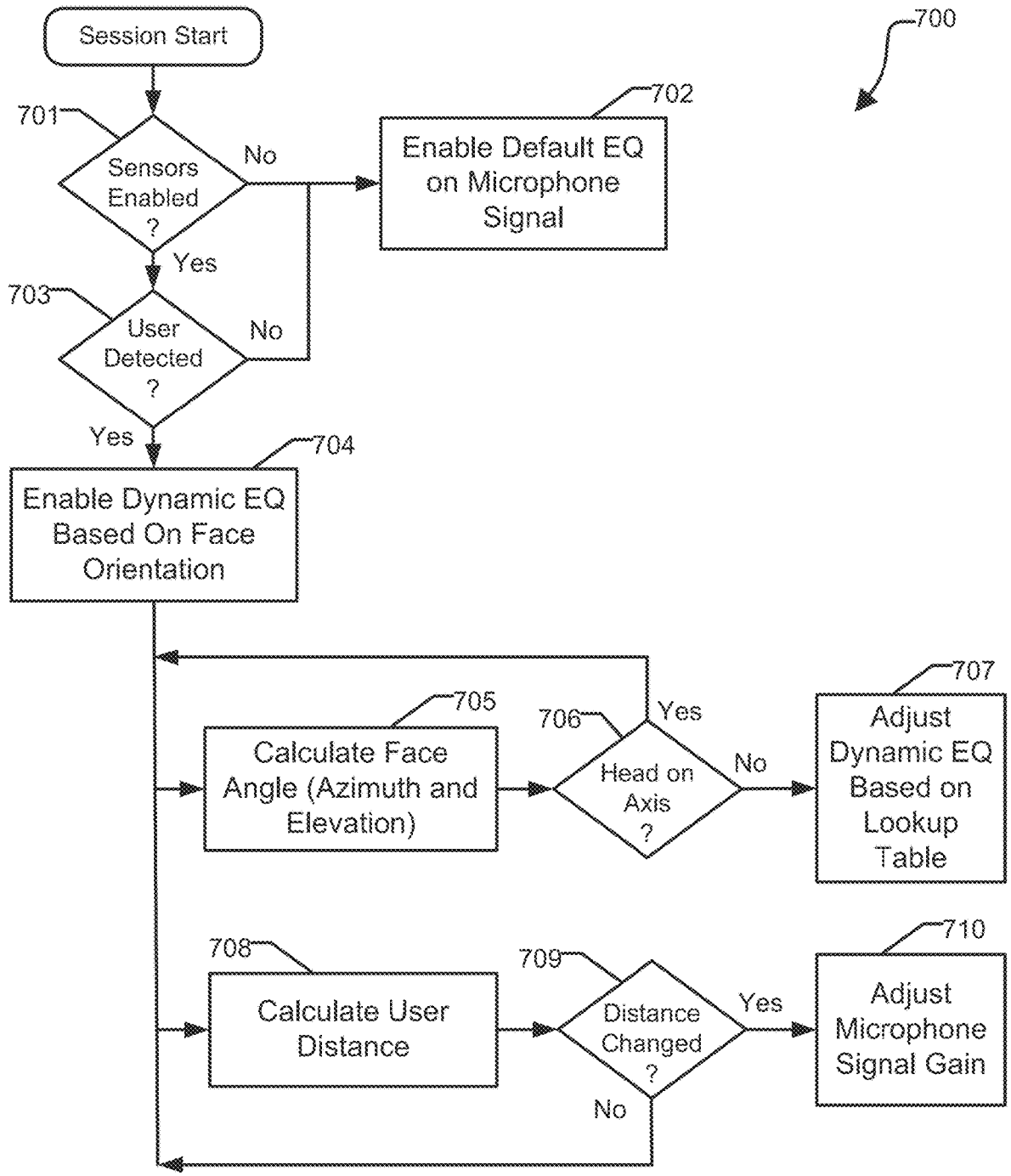
FIG. 7 is a flow diagram illustrating a method for providing voice equalization based on face position tracking, according to a specific embodiment of the present disclosure.

FIG. 7 shows a method 700 for providing voice equalization based on face position tracking, according to a specific embodiment of the present disclosure. Method 700 begins at decision block 701 where it is determined whether sensors, such as LP camera 196 is available and enabled for operation. If the sensors are not enabled, the method proceeds to block 702 where equalization of an audio signal received at microphone 260 is set to a default value, such as a flat frequency response. Method 700 continues at decision block 703 where it is determined whether a user is present at information handling system 100. For example, presence of a user can be identified by analyzing information provided by TOF sensor 192, LP camera 196, and/or HD camera 210. If a user is not detected, method 700 again proceeds to block 702 where equalization of an audio signal received at microphone 260 is set to a default value. If a user is detected, the method continues at block 704 where dynamic equalization of audio received at microphone 260 is enabled. For example, software service 202 and/or software service 206 can configure equalization of the microphone signal based on an orientation of the user's head and a distance between the user and microphone 260.

At block 705, an angle of the user's face relative to the microphone can be calculated. For example, vision system 194 can analyze an image captured by LP camera 196 to determine whether the user is looking in a direction other than directly at microphone 260. If the user is speaking directly at microphone 260, the software service continues to monitor the users head position. If it is determined at decision block 706 that the user is not speaking directly at microphone 260, method 700 proceeds from decision block 706 to block 707 where the audio signal received from microphone 260 is equalized based on information provided by a lookup table. For example, signal processor 208 can be configured to boost or attenuate specific frequencies based on an angle of the users head and information representing a polar pattern of human voice, such as represented by graphs 500 and 600. At block 708, a distance between the user's face and microphone 260 can be calculated, for example using TOF sensor 192. If the distance between the user and microphone 260 changes, method 700 proceeds from decision block 709 to block 710 where the signal received from microphone 260 is adjusted, amplified or attenuated, independent of frequency. For example, the signal received from microphone 260 can be progressively amplified as the user moves further away from microphone 260.

Figure 8:
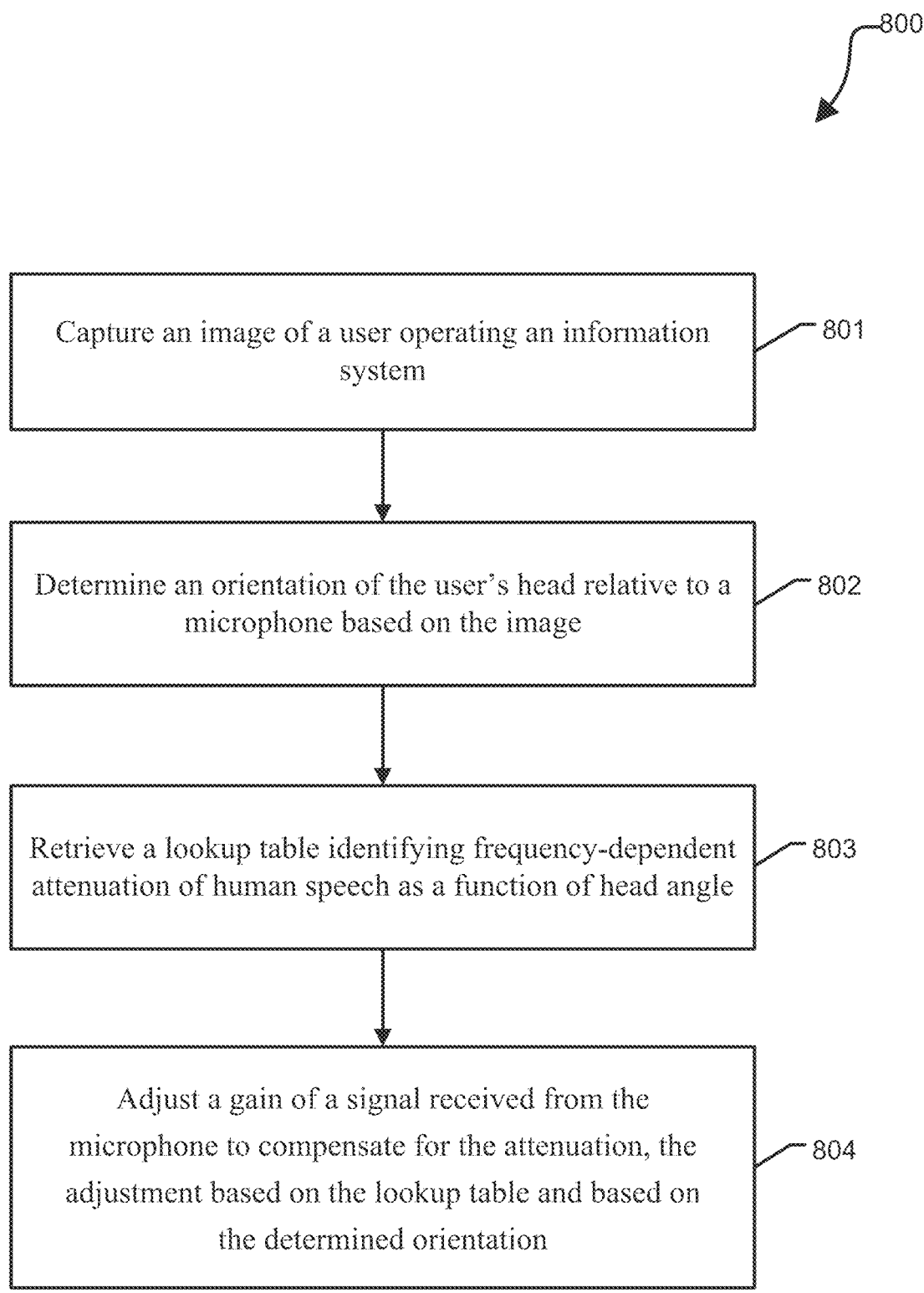
FIG. 8 is a flow diagram illustrating a method for providing voice equalization based on face orientation, according to another embodiment of the present disclosure.

FIG. 8 shows a method 800 for adjusting audio properties based on an orientation of a user's face according to embodiment of the present disclosure. Method 800 begins at block 801 where an image is captured at a camera included at an information handling system. For example, LP camera 196 can be configured to periodically capture an image. At block 802, an orientation of the user's head relative to microphone 260 is determined based on analysis of the image, for example analysis performed by vision system 194. Method 800 continues at block 803 where a lookup table is retrieved, the lookup table identifying frequency-dependent attenuation of human speech as a function of head angle. For example, the lookup table can identify how various frequencies included in human speech may be attenuated based on an angle of the user's head relative to the position of microphone 260. Method 800 completes at block 804 where a gain of a signal received from the microphone is adjusted to compensate for the attenuation, the adjusting based on the lookup table and based on the determined orientation. For example, software service 202 or 206 can periodically or substantially-continuously monitor an orientation of the user's head, and dynamically configure signal processor 208 to compensate for the attenuation of specific frequencies as identified by lookup table 209. As the user moves their head while speaking, the software service can dynamically provide equalization of the microphone signal so that listeners do not perceive frequency variations in the speaker's voice.

The techniques described above are especially suited for a video conference scenario, but are equally useful for when a single user is recording audio using a microphone. For example, a voice recognition system or similar home assistant device can employ the above techniques to adjust equalization of a user's voice based on detecting the user's face position relative to the device's microphone. The above techniques are applicable to information handling systems that include more than one display device, multiple LP cameras, multiple TOF sensors; and systems having additional speakers and microphones. For example, properties of audio signals received at each microphone can be independently adjusted based on the position of the user relative to each microphone. The type and amount of adjustment can be predetermined, such as specified by information stored at information handling system 100. In addition, aspects of the adjustments can be configured based on feedback provided by a user, and the adjustments can be performed in lieu of, or in coordination with audio controls available to the user. The preceding techniques can be performed while maintaining privacy of the user, since images captured by LP camera 196 can be made unavailable to other applications running at information handling system 100.

Referring back to FIG. 1, the information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media. A network interface device (not shown at FIG. 1) can provide connectivity to a network, such as a wide area network (WAN), a local area network (LAN), or other network.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
a display device;
a microphone;
a first camera; and
a software service to:

enable the first camera to capture an image of a user operating the information handling system;
determine an orientation of the user's head relative to the microphone based on the image;
retrieve a lookup table identifying attenuation of a first frequency of human speech as a function of head angle; and
adjust a gain of a signal received from the microphone to compensate for the attenuation of the first frequency, the adjusting based on the lookup table and based on the determined orientation.

2. The information handling system of claim 1, wherein the lookup table identifies attenuation as a function of head angle in a horizontal plane.

3. The information handling system of claim 1, wherein the lookup table identifies attenuation as a function of head angle in a vertical plane.

4. The information handling system of claim 1, further comprising:
a high-definition camera operable to provide video to a video conference system,
wherein the first camera is a low-power camera to generate a low-resolution image relative the power consumption and the resolution of images generated by the high-definition camera.

5. The information handling system of claim 1, wherein the first camera is coupled to a vision system, the vision system configured to determine the orientation of the user's head, the image not provided to other subsystems of the information handling system.

6. The information handling system of claim 5, wherein the vision system is coupled to a sensor hub provided at a chipset included at the information handling system.

7. The information handling system of claim 1, wherein the first camera is a high-definition camera to provide video to a video conference system.

8. The information handling system of claim 1, wherein the lookup table identifies attenuation as a function of head angle in a vertical plane and in a horizontal plane.

9. The information handling system of claim 1, wherein the lookup table further identifies attenuation of a second frequency of human speech as a function of head angle, and the software service is further to adjust the gain of the signal received from the microphone to compensate for the attenuation of the second frequency, the adjusting based on the lookup table and based on the determined orientation.

10. The information handling system of claim 1, wherein the lookup table provides attenuation information corresponding to a plurality of frequency bands.

11. A method comprising:
enabling a first camera to capture an image of a user operating an information handling system;
determining an orientation of the user's head relative to a microphone based on the image;
retrieving a lookup table identifying attenuation of a first frequency of human speech as a function of head angle; and
adjusting a gain of a signal received from the microphone to compensate for the attenuation of the first frequency, the adjusting based on the lookup table and based on the determined orientation.

12. The method of claim 11, wherein the lookup table identifies attenuation as a function of head angle in a horizontal plane.

13. The method of claim 11, wherein the lookup table identifies attenuation as a function of head angle in a vertical plane.

14. The method of claim 11, wherein the first camera is a low-power camera to generate a low-resolution image relative the power consumption and the resolution of images generated by a high-definition camera included at the information handling system.

15. The method of claim 11, wherein the first camera is coupled to a vision system, the vision system configured to determine the orientation of the user's head, the image not provided to other subsystems of the information handling system.

16. The method of claim 15, wherein the vision system is coupled to a sensor hub provided at a chipset included at the information handling system.

17. The method of claim 11, wherein the lookup table further identifies attenuation of a second frequency of human speech as a function of head angle, the method further comprising adjusting the gain of the signal received from the microphone to compensate for the attenuation of the second frequency, the adjusting based on the lookup table and based on the determined orientation.

18. The method of claim 11, wherein the lookup table provides attenuation information corresponding to a plurality of frequency bands.

19. A voice over Internet protocol (VOIP) system comprising:
a microphone;
a first camera;
an equalizer; and
a processor configured to:
capture an image of a user using the first camera;
determine an orientation of the user's head relative to the microphone based on the image;
retrieve a lookup table identifying attenuation of a first frequency band of human speech as a function of head angle; and
configure the equalizer to adjust a gain of the first frequency band of a signal received from the microphone to compensate for the attenuation of the first frequency.

20. The VOIP system of claim 19, further comprising a high-definition camera operable to provide video to the VOIP system, wherein the first camera is a low-power camera to generate a low-resolution image relative to the power consumption and the resolution of images generated by the high-definition camera.

* * * * *